United States Patent [19]
Roth et al.

[11] Patent Number: 6,153,916
[45] Date of Patent: Nov. 28, 2000

[54] MOS TRANSISTOR WITH HIGH OUTPUT VOLTAGE ENDURANCE

[75] Inventors: Walter Roth; Thomas Giebel, both of Dortmund, Germany

[73] Assignee: EL MOS Elektronik in MOS-Technologie GmbH, Dortmund, Germany

[21] Appl. No.: 09/051,068

[22] PCT Filed: Sep. 28, 1996

[86] PCT No.: PCT/EP96/04246

§ 371 Date: Apr. 1, 1998

§ 102(e) Date: Apr. 1, 1998

[87] PCT Pub. No.: WO97/13277

PCT Pub. Date: Apr. 10, 1997

[30] Foreign Application Priority Data

Oct. 2, 1995 [DE] Germany ................ 195 36 753

[51] Int. Cl.[7] .................................................. H01L 29/94
[52] U.S. Cl. .................. 257/409; 257/408; 257/336; 257/339; 257/343; 257/344
[58] Field of Search ................... 257/408, 409, 257/336, 339, 343, 344, 345

[56] References Cited

U.S. PATENT DOCUMENTS

| | | | |
|---|---|---|---|
| 4,308,549 | 12/1981 | Yeh ................................ | 257/409 |
| 4,929,991 | 5/1990 | Blanchard ...................... | 257/339 |
| 5,132,753 | 7/1992 | Chang et al. ................... | 257/408 |
| 5,162,883 | 11/1992 | Fujihira .......................... | 257/139 |
| 5,646,431 | 7/1997 | Hsu et al. ....................... | 257/342 |
| 5,650,658 | 7/1997 | Beasom .......................... | 257/409 |

FOREIGN PATENT DOCUMENTS

| | | |
|---|---|---|
| 0110320 A1 | 6/1984 | European Pat. Off. . |
| 0386779 A3 | 9/1990 | European Pat. Off. . |
| 0400934 A2 | 12/1990 | European Pat. Off. . |
| 0449858 B1 | 10/1991 | European Pat. Off. . |
| 0637846 A2 | 2/1995 | European Pat. Off. . |
| 0660419 A2 | 6/1995 | European Pat. Off. . |
| 3816002 A1 | 12/1988 | Germany . |
| 4336054 A1 | 4/1995 | Germany . |
| 58-140165 | 8/1983 | Japan . |

*Primary Examiner*—John Guay

[57] ABSTRACT

An MOS transistor with high output voltage endurance comprises a semiconductor substrate with the surface thereof including a doping area having a surface doping concentration decreasing from the drain connection area to the drain-side edge of the gate oxide layer. This doping area is formed by ion implantation and subsequent outdiffusion of individual partial areas. The first partial area has a size in the drain-gate extension which is considerably larger than the penetration depth of the outdiffusion in the substrate. The second partial area has a size and a distance to the first partial area which are both smaller than the penetration depth of the outdiffusion in the substrate. In the outdiffused condition, the individual diffusions originating from the individual, respectively adjacent first and second partial areas merge into each other on the surface of the substrate to thus obtain a doping concentration gradient for a constant conduction type of the doping area.

20 Claims, 2 Drawing Sheets

MOS TRANSISTOR WITH HIGH OUTPUT VOLTAGE ENDURANCE

This application claims the benefit under 35 U.S.C. §371 of prior PCT International Application No. PCT/EP96/04246, which has an International filing date of Sep. 28, 1996, which designated the United States of America, the entire contents of which are hereby incorporated by references.

BACKGROUND OF THE INVENTION

1. Field of the Invention

The invention relates to an MOS transistor with high output voltage endurance.

2. Description of the Background Art

In a large number of applications, it is desirable that MOS transistors not be destroyed at their output even in case of high output voltages between 180 V and 200 V. It may happen that a circuit is briefly exposed to such high output voltages due to external influences. Such high voltage peaks occur especially in electronic circuits for motor vehicles. That region of an MOS transistor which is most susceptible for a (irreversible) breakdown is the drain-side edge of the gate because rather high electric fields will occur there due to the edge effect. Notably, for reaching a low switch-on resistance, it is desirable that the region between the drain-side edge of the gate and the drain connector itself has a good electric conductivity. This, however, means that the whole output voltage (in the switched-out condition of the transistor) will decrease in the region of the drain-side edge of the gate. Since the gate oxide layer must have a very small thickness, MOS transistors have only a low output voltage endurance unless special measures are taken.

EP-A-0 449 858 describes an NMOS transistor with increased output voltage endurance. In this transistor, the (excessively doped) drain connection area is surrounded by a less doped well of the same conduction type as in the drain connection area. (In case of an NMOS transistor, this conduction type is the n-type conduction.) This less doped n-type well extends to a region below the drain-side edge of the gate oxide layer. The n-type well is produced by ion implantation and subsequent outdiffusion. As a result of the weaker doping as compared to the drain connection area, a doping area with reduced surface concentration in the lateral direction will be generated between the drain connection area and the drain-side edge of the gate oxide layer. In this weaker-doped n-type well area, which is formed in a p-type substrate, a space-charge zone can then be generated to a sufficient extent to make the NMOS transistor resistant to breakdown even in case of higher output voltages. However, the measure described in EP-A-0 449 858 does not allow for any desired increase of the output voltage endurance of the MOS transistor, so that this approach has its limitations.

SUMMARY OF THE INVENTION

It is an object of the invention to provide an MOS transistor which is distinguished by an improved output voltage endurance and, particularly, is resistant to breakdown also in case of output voltages from 160 V to 180 V in the cut-off condition.

To solve the above object, there is proposed in accordance with the invention an MOS transistor comprising
a semiconductor substrate provided with a weak doping of a first conduction type,
two mutually spaced conduction areas for drain and source formed in the surface of the substrate, the conduction areas being provided with a heavy, up to excessive, doping and being of a second conduction type opposite to the first conduction type,
a gate oxide layer applied on the surface between the two conduction areas for drain and source, having a source-side edge adjacent the source connection area and a drain-side edge spaced from the drain connection area, and
a doping area of the second conduction type extending into the surface of the substrate from the drain connection area to below the gate oxide layer and spaced from the source connection area, the surface concentration of the doping area in the area adjacent the drain connection area being higher than in the region below the gate oxide layer,
the doping area being formed by ion implantation and subsequent outdiffusion of a first partial area adjacent the drain connection area, the size of the first partial area in the drain-gate extension being considerably larger than the penetrating depth of the outdiffusion into the substrate, and of at least one second partial area arranged between the first partial area and the source connection area, the size of the at least one second partial area in the drain-gate extension and the distance thereof to the first partial area being smaller than the penetrating depth of the outdiffusion into the substrate, wherein, while maintaining the same conduction type of the doping area, the individual diffusions originating from the individual, respectively adjacent first and second partial areas merge into each other on the surface of the substrate to thus obtain a doping concentration gradient.

The MOS transistor according to the invention comprising the above features can be provided both as a PMOS and an NMOS transistor. The invention will be explained hereunder with reference to an NMOS transistor.

In the transistor according to the invention, a semiconductor substrate with a weak p-type doping is formed with two connection areas for drain and source. These connection areas are arranged in the surface of the substrate and are provided with a very high, up to excessive, n-type doping (doping concentration higher than $10^{17}$ atoms per $cm^3$). Between the two connection areas, a gate oxide layer is applied on the surface, arranged adjacent the source connection area and at a distance from the drain connection area. Thus, while the source-side edge of the gate oxide layer is flush with the boundary of the source connection area and slightly overlaps it, respectively, the drain-side edge of the gate oxide layer is arranged at a distance from the drain connection area. Formed in the surface of the substrate between the drain connection area and the drain-side edge of the gate oxide layer is a doping area extending to a region below the gate oxide layer. This area is provided with an n-type doping, with the surface concentration being modulated. The modulation is selected such that the surface concentration within the doping area will as a whole decrease from the drain connection area to the source-side area arranged below the gate oxide layer. The decrease of the surface concentration is obtained by ion implantation in a plurality of partial areas arranged between the drain connection area and the drain-side edge of the gate oxide layer, and subsequent outdiffusion of these ion-implanted partial areas.

The ion-implanted partial areas which after their outdiffusion will form the doping area with a surface doping concentration profile decreasing towards the gate, comprise a first partial area whose size in the drain-gate extension is considerably larger than the penetration depth of the outdiffusion into the substrate. This first partial region has a weaker doping than the drain connection area. In addition to the first partial area, a second partial area is provided, arranged at a distance from the first partial area and having a smaller size in the gate-drain extension than the first partial area. The distance of this at least one second partial area to the first partial area is smaller than the penetration depth of the outdiffusion into the substrate. Also the size of the second partial area in the drain-gate extension is smaller than the penetration depth of the outdiffusion into the substrate. This selection of the size of the second partial area and the distance of the second partial area to the first partial area has the effect that, with an equally strong ion implantation of these two partial areas, the lateral outdiffusions will melt into each other. In other words, the partial areas which are still separated after ion implantation, will be connected upon completion of the outdiffusion. As a result, the surface concentration of the doping material in the doping area will decrease towards the drain-side edge of the gate. Due to the decreasing surface concentration towards the gate, the space-charge zone between the substrate and the doping area in the cut-off condition of transistor is increasingly formed in the doping area. Further, the space-charge zone can occupy a larger space so that a larger area will be available in the lateral direction for voltage reduction. This in turn means that the portion of the output voltage decreasing above the gate oxide layer is reduced, or—put the other way around—that, with a numerically identical voltage drop above the gate oxide layer, a generally larger output voltage endurance can be obtained between gate and drain. Because of the space-charge zone which—due to the decreased doping—has been displaced towards the drain, the MOS transistor can be provided with a shorter channel whose minimum length is defined by the punch-through effect. On the whole, the MOS transistor according to the invention requires hardly more space than a conventional MOS transistor.

By the ion implantation, provided by the invention, of individual, mutually spaced partial areas—of which, except for the partial area facing towards the drain connection area, all other partial areas have sizes in the gate-drain extension and distances to other partial areas which are smaller and particularly considerably smaller than the penetration depth of the outdiffusion into the substrate—a gradually decreasing surface doping-material concentration is obtained in the lateral direction between the drain connection area and the gate, the gradual decrease extending to a region below the drain-side edge of the gate. This gradual profile is an approximation—useful in practice—to the ideal linearly decreasing surface concentration profile and offers the decisive technological advantage that the method steps common in an CMOS process (ion implantation and outdiffusion of a well) can be utilized. According to the invention, the decrease of the surface concentration is obtained by the size, the number and the distance of the second partial areas of the doping area. This is ultimately a matter of the masking of the substrate surface during the ion implantation and therefore can be performed quite easily and repeatedly.

As already mentioned above, the doping area is composed of a first and at least one second partial area that has been subjected to ion-implantation and subsequent outdiffusion. In case of a plurality of second partial areas, these are arranged at mutual distances and in successive order in the drain-gate extension between the first partial area and the gate. Advantageously, the second partial areas with increased distance from the first partial area have smaller sizes in their drain-gate extension. Thus, in other words, the closer the second partial areas are located to the gate, the smaller they become (when viewed in the drain-gate extension). In this manner, a step-wise, ever more decreasing surface concentration to the drain-side edge of the gate oxide layer is obtained.

Suitably, in case of a plurality of second partial areas, their mutual distances and the distance of the first partial area to the second partial area closest thereto are substantially identical. By way of alternative, it can be provided that, in case of a plurality of second partial areas, their mutual distances become larger with increasing distance of the second partial areas to the first partial area. By the selection of the width and particularly by the change of the distance of the partial areas, further possibilities are provided for the decrease of the doping material concentration on the surface of the substrate towards the gate. Preferably, the partial area most remote from the drain connection area comprises a large number of—particularly dot-like—areas. Thus, it becomes possible to influence the doping material concentration in three dimensions.

According to an advantageous embodiment of the invention, it is provided that the partial areas have a ring structure. In this case, the first partial area encloses the drain connection area and contacts the same. The second partial areas are arranged as rings around the first partial area at distances from the first partial area and from each other, respectively, and these rings are particularly concentric.

When producing the MOS transistor of the invention, the procedure—with regard to the doping area and the drain connection area—starts with the ion implantation of the partial areas, followed by outdiffusion. Thereafter, the excessively doped drain connection area is produced by ion implantation within the first partial area.

To further reduce the (residual) field strength on the drain-side edge of the gate oxide layer, it is provided according to a second advantageous embodiment of the invention that an intrinsic zone is generated in the surface of the substrate below this drain-side edge. Within the intrinsic zone, there exists, as it were, a zero doping material concentration, contributing to a reduction of the field peak on the drain-side edge of the gate oxide layer. Preferably, also this intrinsic zone is formed as a ring within the doping area.

Suitably, the intrinsic zone is effected by "counterdoping". Through this counterdoping, the electrically active doping of the doping area on the surface can be reduced, in a controlled manner, down to zero. This counterdoping can be realized together with the method step of threshold voltage implantation commonly used in an MOS manufacture process. Thus, the MOS process itself need not be changed for the counterdoping, which is technologically advantageous.

To make it possible that the space-charge zone can further spread in the direction of the source connection area in the cut-off condition of the transistor, it is suitable to limit the threshold voltage implantation of the transistor to the absolutely necessary extent adjacent the source connection area, or, in case of a symmetrical transistor, to perform an implantation only in the center of the channel. A symmetrical transistor comprises the above described doping area—controlledly set with regard to the gradient of the doping material concentration on the surface—both around its source connection area and its drain connection area. In a symmetrical transistor, it is possible to apply a high voltage both to the drain and to the source.

Advantageously, the MOS transistor according to the invention can be realized also with a thicker field oxide layer (a so-called field plate) located adjacent the thin gate oxide layer and having the gate arranged thereon. In this case, the field oxide layer is adjacent to the drain-side edge of the gate oxide layer and thus covers the surface of the substrate in the doping area between the drain connection area and the gate oxide layer while reaching up to the drain connection area. By this field plate, the electric field generated on the surface of the substrate is further reduced, which contributes to reducing the danger of breakdowns on the drain-side edge of the gate.

As evident from the foregoing, the MOS transistor according to the invention is provided with a soft p-n transition on the drain connection area produced in the above described manner. This p-n transition is formed from the doping area and the substrate. Should a breakdown occur in the MOS transistor of the invention due to an excessive output voltage, it is desirable that the breakdown of the p-n transition would not take place on the surface near the gate but deep down in the substrate, so that the p-n transition would experience a vertical breakdown. This is advantageously accomplished by using a highly doped substrate with a weakly doped upper (epitaxy) layer wherein the various areas are formed. Thereby, it is achieved that the space-charge zone of the p-n transition below the drain connection area is confined to such an extent that a breakdown would more likely occur in this area than in the surface area near the gate.

BRIEF DESCRIPTION OF THE DRAWINGS

The embodiments of the invention will be explained in greater detail hereunder with reference to the figures, which are given by way of illustration only and thus are not limitative, and wherein.

DETAILED DESCRIPTION OF THE PREFERRED EMBODIMENTS

Figure 1:
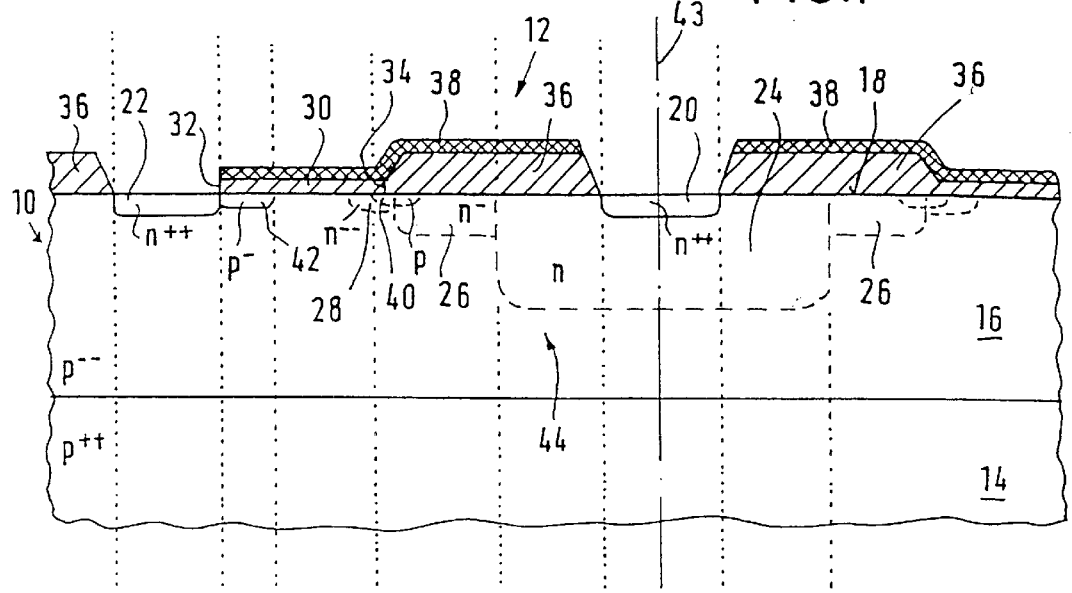
FIG. 1 shows a cross-sectional view through the region of a substrate near the surface, wherein the substrate includes doping areas for an NMOS transistor, with the contacts for the gate, the source and the drain omitted for better survey.

FIG. 1 shows a cross-sectional view through the surface region of a semiconductor substrate 10 provided with the differently doped areas required for an NMOS transistor 12 with high output voltage endurance. The substrate 10 is provided with a p-type doping and comprises a lower layer 14 with a doping $p^{++}$, i.e. an excessive doping (doping concentration above $10^{18}$ electrically active atoms per cm$^3$). Applied on lower layer 14 is an upper (epitaxy) layer 16 comprising a doping $p^{--}$, i.e. a weak doping, and a doping concentration of $10^{14}$ to $10^{15}$ electrically active atoms per cm$^3$. The thickness of upper layer 16 is between 5 $\mu$m and 6 $\mu$m. Within surface 18, there is formed a large number of differently doped areas which will be described hereunder.

For the connection of the drain and the source, surface 18 of substrate 10 comprises connection areas 20 and 22, respectively, which have an excessive $n^{++}$-type doping. While the source connection area 22 is formed immediately in the $p^{--}$-type doped material of upper layer 16, the drain connection area 20 is arranged in a first doping partial area 24 having a weaker n-type doping than the drain connection area 20. (The doping concentration in the first doping partial area 24 is about $10^{17}$ electrically active atoms per cm$^3$). The depth of the doped first partial area 24 is 3 $\mu$m to 4 $\mu$m. Arranged around the first partial area 24 is a second partial area 26 having an $n^-$-type doping, i.e. a weaker doping than the first partial area 24. The doping concentration in the second partial area 26 is $10^{16}$ electrically active atoms per cm$^3$. The second doping area 26 extends as a circumferential ring around the first partial area 24. A further (second) doped partial area 28 with an $n^{--}$-type doping is arranged externally around second doping area 26. Thus, the doping concentration of this further second partial area 28 is lower than that of the first second partial area 26 and amounts to about $10^{14}$ to $10^{15}$ electrically active atoms per cm$^3$. As illustrated in FIG. 1 by interrupted lines, the depth of partial area 26 is less than the depth of first partial area 24; also, the depth of the further second partial area 28 is less than the depth of the first partial area 24. In other words, this means that the depth of the n-type doping decreases from the drain connection area 20.

Because of the ring structure, the partial areas 24, 26 and 28 extend partially between the two connection areas 20 and 22 in the region of substrate 10 near the surface. The further second partial area 28 is arranged at a distance from the source connection area 22. In this region, the surface 18 of the upper layer 16 of substrate 10 has a thin gate oxide layer 30 applied thereon. The source-side edge 32 of the gate oxide layer 30 facing towards the source connection area 22 is flush with the source connection area 22. In contrast thereto, the drain-side edge 34 of the gate oxide layer 30 facing toward the drain connection area 20 overlaps the further second partial area 28. A thick field oxide layer 36 is arranged between the gate oxide layer 30 and the drain connection area 20. Both oxide layers 30 and 36 are covered by a polysilicon gate 38. Field oxide layers 36 are arranged also in the surface region of the NMOS transistor 12 on the substrate.

Arranged in the transition region between the two second partial areas 26 and 28 is a p-type doped area 40 which like the partial areas 24, 26 and 28 is of a ring structure. This annular area 40 is provided with such a massive p-counterdoping that the overall doping material concentration in the area 40 will be near zero (intrinsic, i.e. a doping concentration less than substantially $10^{12}$ electrically active atoms per cm$^3$). The arrangement of the area 40 within the surface 18 of substrate 10 is such that the area 40 extends below the drain-side edge 34 of the gate oxide layer 30.

Adjacent to the source connection area 22 and below the gate oxide layer 30, the surface 18 of substrate 10 comprises a $p^-$-type doped area 42 provided for setting the threshold voltage of NMOS transistor 12. This $p^-$-type doped area 42 is again formed as a ring and extends not over the whole length between the source connection area 22 and the second partial area 28 but instead is arranged at a distance to the latter.

As shown in the Figures, the NMOS transistor 12 is of a symmetrical configuration relative to axis 43. The connection areas 20,22 and the partial areas 24, 26,28 and 42 are formed concentrically to axis 43. This is the case also for the oxide layers 30 and 36 and the polysilicon layer 38. The source, which thus surrounds the ring-gate and -drain as a kind of guard ring, protects the circuit areas of substrate 10 adjacent the NMOS transistor.

Figure 2:
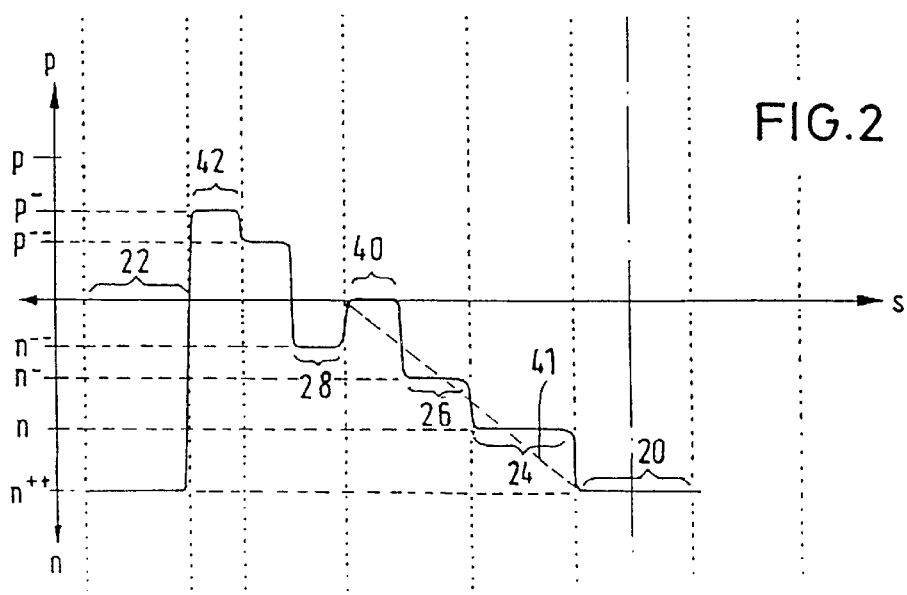
FIG. 2 shows the development of the surface doping concentration along the lateral extension between the source and drain connection areas.

In the lateral direction between the connection areas 20 and 22 along the surface 18 of substrate 10, the development of the doping concentration is a s shown in FIG. 2. The Figure shows the intrinsic doping concentration in the area 40 and the development of the doping concentration which gradually increases from there to the drain connection area and comes rather close to the ideal linear course 41 (shown in interrupted lines). By this slow decrease of the doping concentration from the value in the drain connection area 20 up to the intrinsic value on the drain-side edge 34 of the gate oxide layer 30, a sufficiently large area is generated therebetween for the spreading of the space-charge zone in the cut-off condition of NMOS transistor 12. Thus, in comparison to conventional NMOS transistors, the space-charge zone is shifted towards the drain connection area 20. Therefore, it extends less far below the gate oxide layer 30 in the direction of the source connection area 22. Accordingly, the NMOS transistor 12 can be designed to have a smaller minimum channel length (punch-through effect). The widened space-charge zone contributes to the reduction of output voltages between the drain connection area 20 and the polysilicon gate 38 so that a lesser percentage decrease is needed above the gate oxide layer 30 on the drain-side edge 34. This will reduce the danger of a breakdown in this region or, put differently, the NMOS transistor 12 will be protected from breakdown even in case of high output voltages. Also the intrinsic area 40 below the drain-side edge 34 of the gate oxide layer 30 contributes to the increased protection against breakdown. Likewise, the field oxide layer 36 or so-called field plate joining the gate oxide layer 30 contributes to the reduction of the danger of a breakdown in the gate oxide layer 30.

Next, the manufacture of the doping area 44 composed of the three partial areas 24, 26 and 28 will be explained. What is special about the generation of this doping area 44 is the employment of the ion implantation and outdiffusion steps commonly used for MOS processes.

Figure 3:
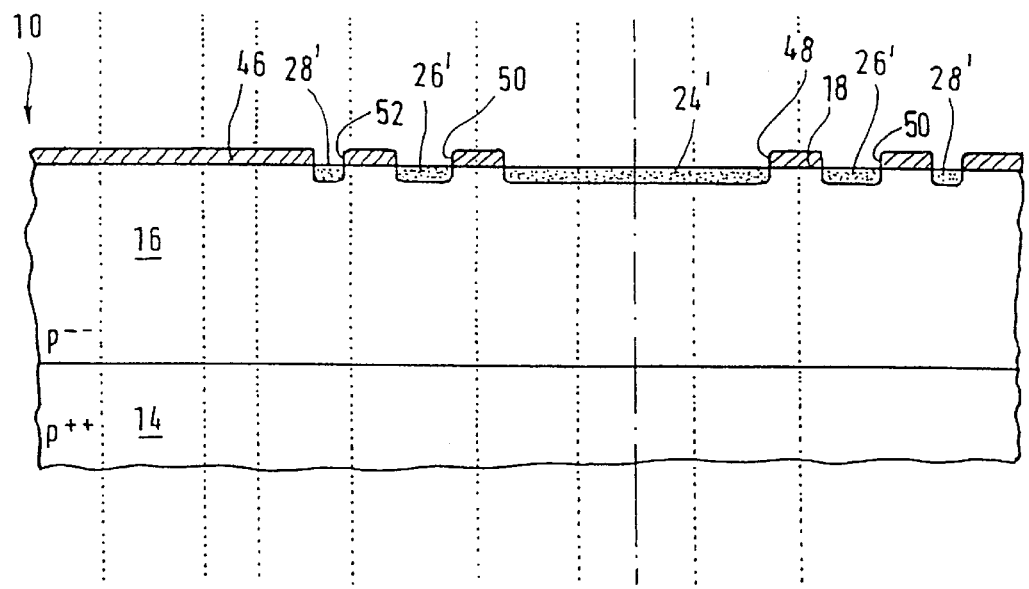
FIG. 3 shows the ion implantation step for generating the doping area between the drain and the gate.

As evident from the graphic representation of the ion implantation step according to FIG. 3, the surface 18 of substrate 10 is covered by a resist mask 46. The resist mask 46 is formed with a first, large opening 48 for insertion of ions for the later first doping partial area 24. Around opening 48, an annular opening 50 is formed in the resist mask 46. Through this annular opening 50, ions for producing the second doping partial area 26 are implanted into the surface of the substrate. In this configuration, the distance from the annular opening 50 to the opening 48 and the lateral width of the annular opening 50 are selected to be small relative to the penetration depth of the ions during the subsequent outdiffusion. This restriction does not apply to the opening 48 which has a considerably larger size than the diffusion length. Around annular opening 50 and at a distance therefrom, a second annular opening 52 is formed in the resist mask 46. Through this second annular opening 52, the ions required for the generation of the (further) second partial area 28 are introduced into the substrate. The statements made above in connection with annular opening 50 likewise apply to the distance between annular opening 52 and annular opening 50 and to the lateral width of annular opening 52, with the lateral width of annular opening 52 being selected to be smaller than the lateral width of annular opening 50. In FIG. 3, the ion-implanted areas which by the subsequent outdiffusion process are formed into the doped partial areas 24, 26 and 28, are designated by 24', 26' and 28'.

If, for instance, the length of the outdiffusion, i.e. the maximum penetration depth of the implanted ions in the central area of the ion-implanted area 24', is 3.5 µm, the distance from the annular opening 50 to the opening 48 and the distance from the annular opening 52 to annular opening 50 is respectively 1.4 µm. The lateral dimension of annular opening 50 is about 2 µm while the annular opening 52 has a lateral dimension of about 1 µm.

Figure 4:
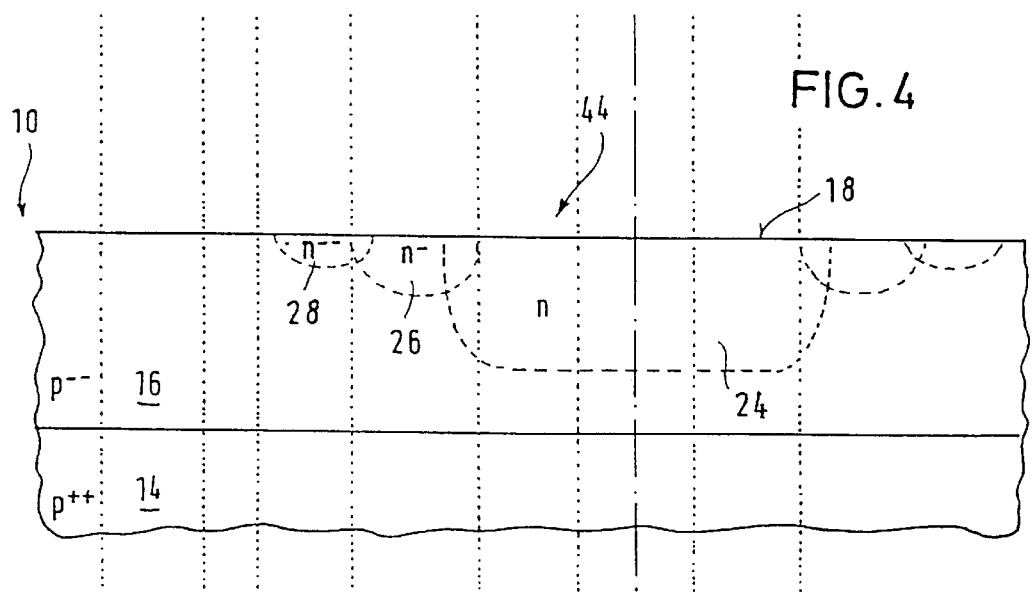
FIG. 4 shows the situation after the outdiffusion of the partial areas subjected to ion implantation according to FIG. 3.

As shown in FIG. 4, the masking of the substrate 10 during the ion implantation according to FIG. 3 will result—after the thermal outdiffusion—in the doping area 44 comprising the doping partial areas 24, 26 and 28, the penetration depth is gradually different among them. The penetration depth within the second partial areas 26 and 28 is less than within the first partial area 24, since the percentage of lateral diffusion in these second partial areas 26 and 28 is considerably larger than the vertical diffusion when both are compared to the condition in the first partial area 24. Due to these different diffusions, the doping material concentration on the surface 18 of substrate 10 will generally decrease from the first partial area 24 via the second partial area 26 to the further second partial area 28. This is true also for the areas of the substrate 10 near the surface wherein the partial areas 24, 26 and 28 are formed.

As can be seen in FIGS. 3 and 4, the advantage of the presently described modulation of the doping material concentration in the region between the drain connection area 20 and the gate oxide layer 30 resides in that the technologically critical process steps "implantation" and "outdiffusion" can be maintained unchanged. Thus, if the generation of the doping area 44 is performed with the doping concentration decreasing towards the gate as shown in FIGS. 3 and 4, the doping profile will inevitably be one according to FIG. 4 and FIG. 1.

As further evident from FIGS. 1 and 4, the distance between the lower boundary of the first doping partial area 24 and the separating region between the two layers 14 and 16 of the substrate is relatively small. If the thickness of the upper layer 16 is between 5 µm and 6 µm and the length of the outdiffusion is about 3.5 µm, the distance will be between 1.5 µm and 2.5 µm. Due to this small distance and the fact that, while maintaining this relatively small distance, the high to heavily doped lower layer 14 is arranged to follow in the vertical direction of substrate 10, the space-charge zone between the first partial area 24 and the substrate 10 in the lower region is massively restricted. In this manner, it can be accomplished that a breakdown of the p-n transition would occur rather in the vertical direction than in the lateral direction on the drain-side edge 34 of the gate oxide layer 30. In case of a vertical breakdown of the p-n transition, it is relatively more likely that such a breakdown is reversible because more substrate material exists in the vertical direction than in the lateral direction so that this substrate material is thermally more resistant than in the region of the drain-side edge 34 of the gate oxide layer 30.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An MOS transistor with high output voltage endurance comprising:

a semiconductor substrate provided with a weak doping of a first conductivity type;

drain and source conduction areas formed in a surface of the substrate, the conduction areas being provided with a heavy to excessive doping and being of a second conductivity type opposite the first conductivity type;

a gate oxide layer applied on the surface of the substrate under a gate and between the conduction areas, the gate oxide layer having a source-side edge adjacent the source conduction area and a drain-side edge spaced from the drain conduction area;

a doping area of the second conductivity type extending into the surface of the substrate from the drain conduction area to below the gate and spaced from the source conduction area, a surface concentration of the doping area in an area adjacent the drain conduction area being higher than in a region below the gate; and an intrinsic zone arranged in the surface of the substrate within the doping area below the drain-side edge of the gate oxide layer, the doping area comprising a first partial area adjacent the drain conduction area, a size of the first partial area along a lateral direction between the conduction areas being considerably larger than a penetrating depth of outdiffusion of the first partial area into the substrate, and at least one second partial area arranged between the first partial area and the source conduction area, a size of the at least second partial area along the lateral direction and a distance of the at least one partial area to the first partial area being smaller than a penetrating depth of outdiffusion of the at least one second partial area into the substrate, the first and second partial areas being ion implanted and merging into each other on the surface of the substrate by outdiffusion to thus form the doping area having a doping concentration gradient.

2. The MOS transistor according to claim 1, comprising a plurality of adjacent second partial areas having sizes along the lateral direction and distances from each other and the first partial area, respectively, that are smaller than a penetrating depth of outdiffusion of the second partial areas into the substrate, sizes of the second partial areas along the lateral direction decreasing with increasing distance of the second partial areas from the first partial area.

3. The MOS transistor according to claim 2, wherein the distances between adjacent second partial areas are respectively substantially identical.

4. The MOS transistor according to claim 1, comprising a plurality of adjacent second partial areas having sizes along the lateral direction and distances from each other and the first partial area, respectively, that are smaller than a penetrating depth of outdiffusion of the second partial areas into the substrate, distances between respectively adjacent second partial areas increasing with increasing distance of the second partial areas from the first partial area.

5. The MOS transistor according to claim 5, wherein the first partial area extends around the drain conduction area, and the at least one second partial area is formed as a ring extending around the first partial area and arranged at a distance therefrom.

6. The MOS transistor according to claim 1, wherein the intrinsic zone is an additional doped area of the first conductivity type.

7. The MOS transistor according to claim 1, further comprising an area of the first conductivity type doped for setting a threshold voltage of the MOS transistor, the area being arranged below the gate oxide layer adjacent the source conduction area and spaced from a nearest outdiffused second partial area.

8. The MOS transistor according to claim 1, wherein a drain-side edge of the gate oxide layer is continuous with a field oxide layer that is thicker than the gate oxide layer.

9. The MOS transistor according to claim 1, wherein the substrate comprises an upper layer including the surface, and a lower layer supporting the upper layer, the upper layer being considerably less doped than the lower layer.

10. The MOS transistor according to claim 1, comprising a plurality of second partial areas, one of the second partial areas arranged at a largest distance from the drain conduction area consisting of adjacent dot-like areas.

11. The MOS transistor according to claim 1, having a configuration concentric with or symmetrical to an axis extending vertically to the surface of the substrate and through the drain conduction area.

12. An MOS transistor comprising:
a semiconductor substrate of a first conductivity type;
drain and source conduction areas of a second conductivity type separately formed in a surface of the substrate, the second conductivity type being opposite the first conductivity type;
a gate oxide layer formed on the surface of the substrate under a gate between the drain and source conduction areas, the gate oxide layer having a source-side edge adjacent the source conduction area and a drain-side edge spaced from the drain conduction area; and
a plurality of doped areas of the second conductivity type merged together and extending into the surface of the substrate from the drain conduction area to below the gate, the merged doped area having a doping concentration gradient that decreases in a lateral direction from the drain conduction area toward the gate,
wherein the merged doped area further comprises an intrinsic doped area below the drain-side edge of the gate.

13. The MOS transistor of claim 12, wherein the intrinsic doped area is of the first conductivity type and is formed by ion implantation and outdiffusion.

14. The MOS transistor of claim 12, wherein a first of the plurality of doped areas surrounds the drain conduction area, and a second of the plurality of doped areas is formed as a ring around the first doped area.

15. The MOS transistor of claim 12, wherein the plurality of doped areas are formed by ion implantation and are merged together by outdiffusion to form the merged doped area.

16. The MOS transistor of claim 12, wherein penetrating depth of the merged doped area into the substrate decreases from the drain conduction area toward the gate.

17. The MOS transistor of claim 12, further comprising a field oxide layer formed continuous with the drain-side edge of the gate oxide layer, the field oxide layer being considerably thicker than the gate oxide layer.

18. The MOS transistor of claim 12, wherein the substrate comprises an upper layer including the surface, and a lower layer supporting the upper layer, the upper layer being considerably less doped than the lower layer.

19. The MOS transistor of claim 12, having a configuration concentric with or symmetrical to an axis extending vertically through the surface of the substrate in the drain conduction area.

20. An MOS transistor with high output voltage endurance comprising:
a semiconductor substrate provided with a weak doping of a first conductivity type;
drain and source conduction areas formed in a surface of the substrate, the conduction areas being provided with a heavy to excessive doping and being of a second conductivity type opposite the first conductivity type;
a gate oxide layer applied on the surface of the substrate between the conduction areas, the gate oxide layer having a source-side edge adjacent the source conduction area and a drain-side edge spaced from the drain conduction area;

a doping area of the second conductivity type extending into the surface of the substrate from the drain conduction area to below the gate oxide layer and spaced from the source conduction area, a surface concentration of the doping area in an area adjacent the drain conduction area being higher than in a region below the gate oxide layer, the doping area comprising a first partial area adjacent the drain conduction area, a size of the first partial area along a lateral direction between the conduction areas being considerably larger than a penetrating depth of outdiffusion of the first partial area into the substrate, and at least one second partial area arranged between the first partial area and the source conduction area, a size of the at least second partial area along the lateral direction and a distance of the at least one partial area to the first partial area being smaller than a penetrating depth of outdiffusion of the at least one second partial area into the substrate, the first and second partial areas being ion implanted and merging into each other on the surface of the substrate by outdiffusion to thus form the doping area having a doping concentration gradient; and an intrinsic zone arranged in the surface of the substrate within the doping area below the drain side edge of the gate oxide layer.

* * * * *